United States Patent
Krieger et al.

(10) Patent No.: US 7,103,831 B1
(45) Date of Patent: Sep. 5, 2006

(54) BURST RELIABILITY AND ERROR LOCATOR FOR TRELLIS CODES

(75) Inventors: Abraham Krieger, San Diego, CA (US); Donald Brian Eidson, San Diego, CA (US)

(73) Assignee: Conexant Systems, Inc., Newport Beach, CA (US)

( * ) Notice: Subject to any disclaimer, the term of this patent is extended or adjusted under 35 U.S.C. 154(b) by 526 days.

(21) Appl. No.: 10/350,303

(22) Filed: Jan. 22, 2003

(51) Int. Cl.
*H03M 13/00* (2006.01)

(52) U.S. Cl. .................................................. 714/792
(58) Field of Classification Search ................. 714/792
See application file for complete search history.

(56) References Cited

U.S. PATENT DOCUMENTS

| | | | | |
|---|---|---|---|---|
| 5,181,209 | A | | 1/1993 | Hagenauer et al. ......... 714/795 |
| 5,537,444 | A | | 7/1996 | Nill et al. ................... 375/341 |
| 5,841,817 | A | | 11/1998 | Krieger et al. .............. 375/340 |
| 5,844,946 | A | * | 12/1998 | Nagayasu .................... 375/341 |
| 6,134,697 | A | * | 10/2000 | Jekal .......................... 714/792 |
| 6,343,103 | B1 | * | 1/2002 | Lou et al. .................... 375/261 |
| 6,408,420 | B1 | * | 6/2002 | Todoroki ..................... 714/795 |
| 6,701,483 | B1 | * | 3/2004 | Heegard et al. ............. 714/791 |
| 6,708,308 | B1 | * | 3/2004 | De Souza et al. ........... 714/795 |

OTHER PUBLICATIONS

Bahl, L. R., et al., *Optimal Decoding of Linear Codes for Minimizing Symbol Error Rate;* IEEE Transactions on Information Theory, Mar. 1974, pp. 284-287.

Hagenauer, J. and Hoeher, P., *A Viterbi Algorithm with Soft-Decision Outputs and its Applications;* Proceedings of IEEE Globecom '89; Dallas, Texas, Nov. 1989; pp. 47.1.1-47.1.7.

Nill, C. and Sundberg, C.W., *List and Soft Symbol Output Viterbi Algorithms: Extensions and Comparisons*, IEEE Transactions on Communications, vol. 43, Nos. 2/3/4, Feb./Mar./Apr. 1995, pp. 277-287.

Viterbi, A., *Error Bounds for Convolutional Codes and an Asymptotically Optimum Decoding Algorithm;* IEEE Transactions on Information Theory, vol. IT-13, Apr. 1967, pp. 260-269.

Viterbi, A., *An Intuitive Justification and a Simplified Implementation of the MAP Decoder for Convolutional Codes;* IEEE Journal of Selected Areas in Communications, vol. 16, No. 2, Feb. 1998, pp. 260-264.

* cited by examiner

*Primary Examiner*—Shelly Chase
(74) *Attorney, Agent, or Firm*—Howrey LLP

(57) ABSTRACT

A method and system are described for assigning reliability metrics to error correction coded bits or symbols that are decoded. Survivor and non-survivor paths through a portion of a trellis representation within a sliding window are determined and recorded. Primary and non-primary traceback paths through a portion of the trellis representation are determined from the recorded data. If the primary and non-primary traceback paths diverge at a release point, a reliability metric is assigned to the bit or symbol estimate corresponding to the release point. This metric is derived from the difference between the path metrics of the primary and non-primary traceback paths. Alternately, if the two paths diverge through all or a portion of a release zone, a reliability metric is assigned to the block of bit or symbol estimates corresponding to the portion or more of the release zone where the two paths diverge from one another. Again, this metric is derived from the difference between the path metrics of the primary and non-primary traceback paths.

32 Claims, 15 Drawing Sheets

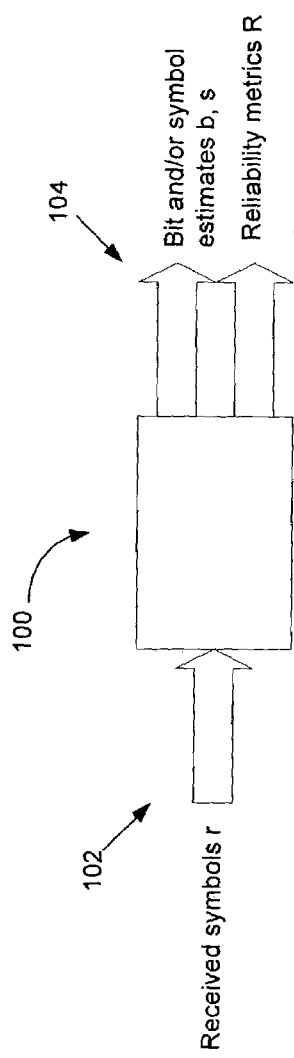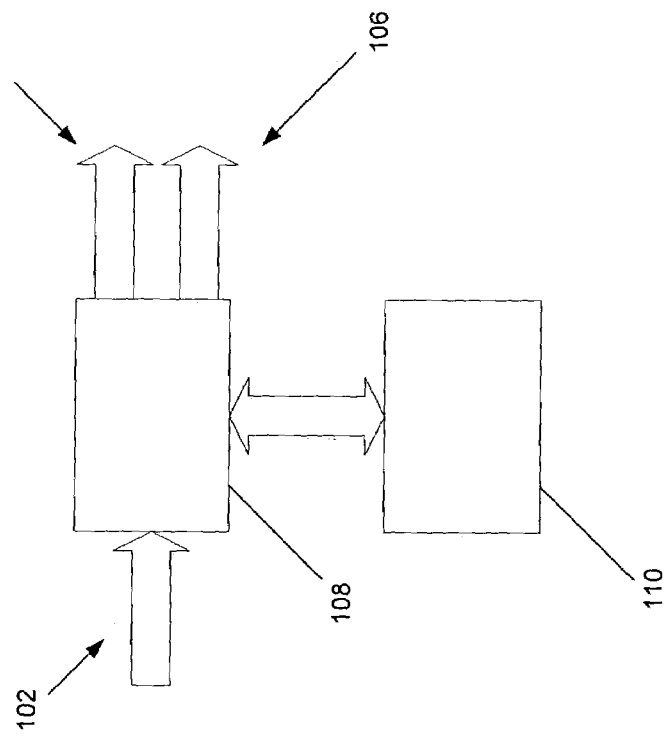

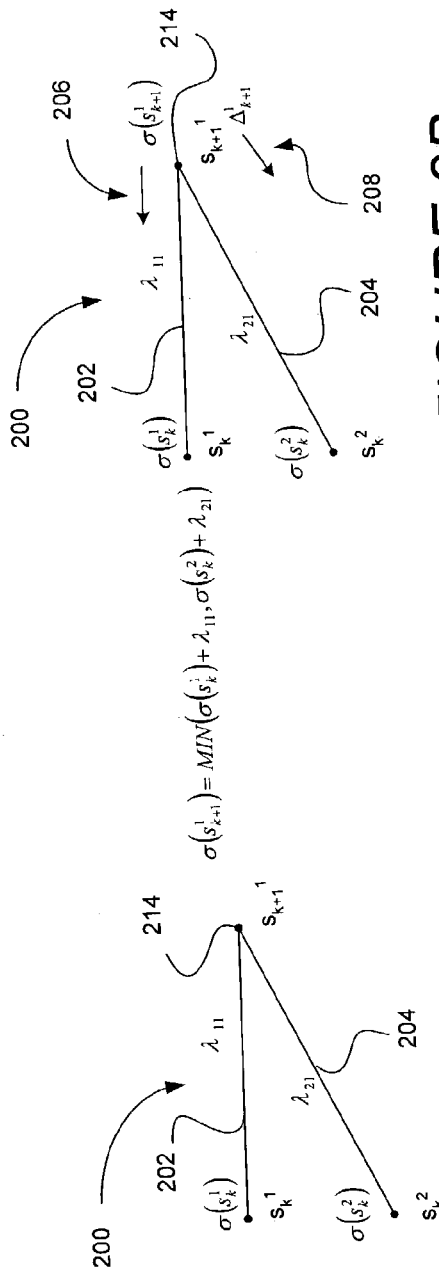
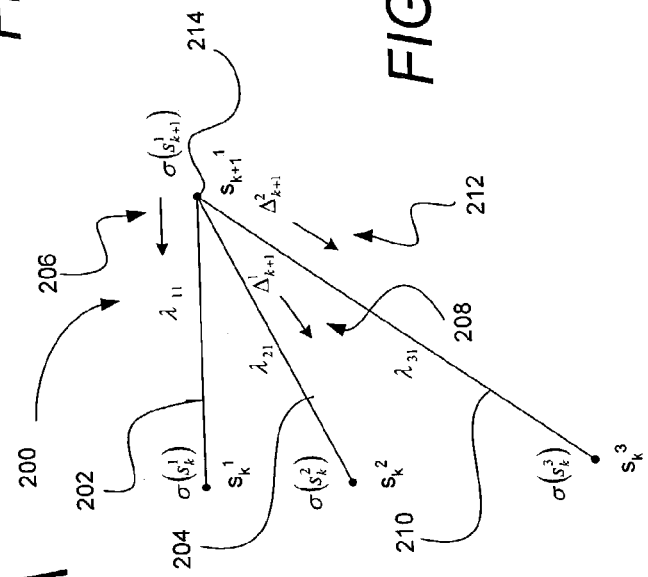
*FIGURE 2A*
*FIGURE 2B*
*FIGURE 2C*

BURST RELIABILITY AND ERROR LOCATOR FOR TRELLIS CODES

BACKGROUND OF THE INVENTION

1. Field of the Invention

This invention relates generally to the field of trellis codes, and, more specifically, to locating burst errors and assigning reliability metrics to bits or symbols during the decoding of trellis codes.

2. Related Art

Trellis codes are codes that can be represented through a diagram of states and state transitions known as a trellis. Examples of trellis codes include convolutional codes, concatenations of convolutional codes, and some block codes. A characteristic of trellis codes is that, during the decoding process, a decoding error can manifest itself in the form of a burst of errors in the bit or symbol estimates output by the decoder. The length of a burst event, and its probability of occurrence, is governed by the free distance and weight distribution of the code. Decoded information that is the product of burst errors may be unreliable, although difficult to detect.

Several techniques are available for producing reliability indicators for decoded information produced by decoders of trellis codes. Examples include a maximum a posteriori (MAP) decoder proposed by Bahl that maximizes the probability that a particular bit in the decoded stream was reliably transmitted given knowledge of the entire received data record. See L. R. Bahl et al., "Optimal Decoding of Linear Codes For Minimizing Symbol Error Rate," IEEE Transactions on Information Theory, vol. IT-20, pp. 284–87 (1974), which is incorporated herein by reference. An adjunct of this method, called the a posteriori probability (APP) algorithm, can be used to provide soft outputs concerning the reliability decision.

Another example is the technique proposed by Krieger and Kent, which uses a different set of recursions to achieve similar performance. See A. Krieger & M. Kent, "Apparatus and Methods for Signal Recovery in a Digital Communication System," U.S. Pat. No. 5,841,817, which is incorporated herein by reference.

Viterbi applied a simplified dual-maxima sliding approximation coupled with an improved memory management system to the APP algorithm, and was thereby able to reduce the complexity of MAP-type algorithms to about four-times that of the original Viterbi algorithm. See A. J. Viterbi, "An Intuitive Justification and a Simplified Implementation of the MAP Decoder for Convolutional Codes," IEEE Journal on Selected Areas in Communications, vol. 16, no. 2, pp. 260–64 (February 1998), which is incorporated herein by reference.

Hagenauer and Hoeher proposed a soft output Viterbi algorithm (SOVA), which, in comparison to the APP algorithm, does not strive to optimize probability estimates, but instead strives for a compromise between complexity and performance. See J. Hagenauer & P. Hoeher, "A Viterbi Algorithm With Soft-Decision Outputs and its applications," Proceedings of IEEE GLOBECOM, Dallas, Tex. sec. 47.1.1–47.1.7 (1989); U.S. Pat. No. 5,181,209, both of which are incorporated herein by reference.

Finally, Nill and Sundberg proposed a soft list Viterbi algorithm (Soft-LVA). See C. Nill & C. E. Sundberg, "List and Soft Symbol Output Viterbi Algorithms: Extensions and Comparisons," IEEE Transactions on Communications, vol. 43, nos. 2/3/4, pp. 277–87 (Feb. Mar. April 1995); U.S. Pat. No. 5,537,444, both of which are incorporated herein by reference. This technique uses a serial list Viterbi algorithm to trace back in the trellis diagram the L most likely paths over the data. For every bit location, it assigns the path metric difference between best path and the first alternative path having a bit output different from the best path, this path metric difference being used as the reliability metric.

However, these approaches are either computationally intensive and require data termination, which makes them unsuitable for applications requiring constant assessment of streaming data, or provide bit-specific reliability indicators which are inadequate indicators of burst errors.

In the Soft-LVA algorithm, for example, data termination is required: a continuous data stream overwhelms the algorithm. Moreover, a bit location is assigned full confidence if all of the Soft-LVA algorithm's alternative paths decode that bit the same way as the best path. This process yields overly optimistic estimates of reliability when differentials between the best and alternative path metrics are small A phenomenon related to this is that the "granularity" of the Soft-LVA algorithm is not very fine. Alternative paths span only a small number of bit locations in the data record; therefore, when the decoding outcome is the same over all alternative paths, there is no way to differentiate between them, and a large number of bits may thus anomalously be assigned a maximum reliability indicator. Furthermore, the bit metrics assigned by the Soft-LVA algorithm are not good indicators of symbol reliability, as one decoded bit within a symbol may erroneously align itself with the best-path decoded bit. Likewise, the Soft-LVA algorithm does not provide a good burst error indicator because individual bits within a burst may erroneously be assigned a high reliability.

SUMMARY

A method is described of augmenting at least a portion of a trellis representation to indicate non-survivor paths and path metric differentials related thereto. The method begins by determining a survivor path entering a node within the portion of the trellis representation, the survivor path having a path metric. Then, a pointer to the survivor path is stored at the node.

Next, a non-survivor path entering the node is determined, the non-survivor path having a path metric. A path metric differential is assigned to the non-survivor path, wherein the path metric differential is derived from the difference between the path metrics of the survivor and non-survivor paths. A pointer to the non-survivor path is stored at the node along with the path metric differential assigned to the non-survivor path.

The method may iterate for additional nodes in the trellis representation.

A method is also described of assigning a reliability metric to a bit or symbol estimate corresponding to a release point in a trellis representation. The method begins by updating the trellis representation with additional states and state transitions to reflect the receipt of trellis encoded symbols over a communications channel, and moving a sliding window within the trellis representation, the sliding window containing a portion of the trellis representation and the release point.

A first path through the portion of the trellis representation within the sliding window is then determined, the first path having a path metric. A second path through the portion of the trellis representation within the sliding window is also determined. This second path diverges from first path at the release point, and has a path metric.

A bit or symbol estimate corresponding to the release point is assigned a reliability metric derived from the difference in path metrics for the first and second paths.

In one implementation, the first path is the primary traceback path through the portion of the trellis representation within the sliding window, and the second path is the best non-primary traceback path that diverges from the primary path at the release point.

A method is further described of assigning a reliability metric to a block of bit or symbol estimates corresponding to at least a portion of a release zone in the trellis representation. The method begins by updating the trellis representation with states and state transitions to reflect the receipt of trellis encoded symbols over a communications channel, and moving a sliding window within the trellis representation, the window containing a portion of the trellis representation and the release zone.

A first path through the portion of the trellis representation within the window is determined, the first path having a path metric. A second path through the portion of the trellis representation within the sliding window is also determined. This second path diverges from the first path throughout at least a portion of the release zone.

A block of bit or symbol estimates corresponding to the portion of the release zone is assigned a reliability metric derived from the difference between the reliability metrics for the first and second paths.

In one implementation, the first path is the primary traceback path through the portion of the trellis representation within the sliding window, and the second path is the best non-primary traceback path that diverges from the primary path over the portion of the release zone.

Related systems and memories tangibly embodying the foregoing methods are also described.

BRIEF DESCRIPTION OF THE FIGURES

The invention can be better understood with reference to the following figures. The components in the figures are not necessarily to scale, emphasis instead being placed upon illustrating the principles of the invention. Moreover, in the figures, like reference numerals designate corresponding parts throughout the different views.

FIG. 1A is a block diagram of an embodiment of a system according to the invention for producing reliability metrics for bit or symbol estimates, wherein the reliability metrics are useful indicators of burst errors.

FIG. 1B is an implementation of the system of FIG. 1A.

FIGS. 2A–2C illustrate an example of the process of augmenting at least a portion of a trellis representation by storing, at each of one or more of the nodes, a pointer to a survivor path, pointers to one or more non-survivor paths, and path metric differentials for each of the non-survivor paths.

DETAILED DESCRIPTION

Figure 3A:
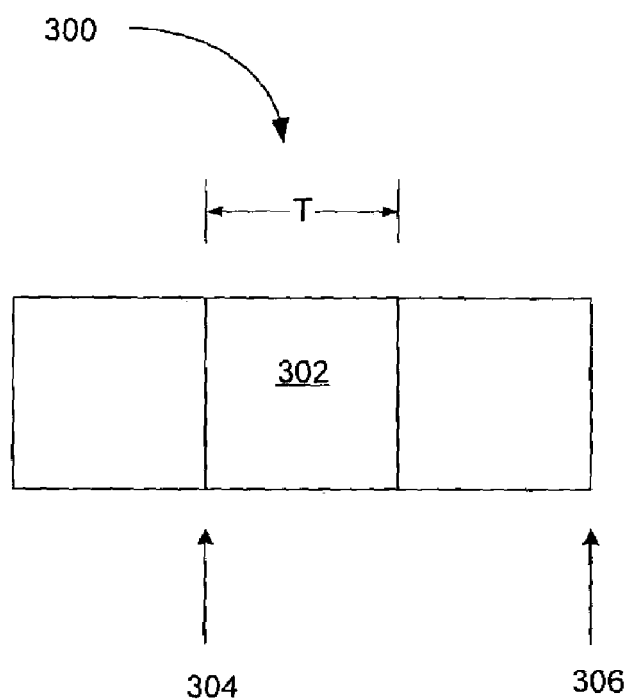
FIGS. 3A–3C illustrate an example of the process of updating a trellis representation with states and state transitions to reflect the receipt of encoded symbols over a communications channel, and correspondingly moving a sliding window having a release point through the trellis representation.

As utilized herein, terms such as "about" and "substantially" are intended to allow some leeway in mathematical exactness to account for tolerances that are acceptable in the trade. Accordingly, any deviations upward or downward from the value modified by the terms "about" or "substantially" in the range of 1% to 20% should be considered to be explicitly within the scope of the stated value.

Moreover, as used herein, the term "software" includes source code, assembly language code, binary code, firmware, macro-instructions, micro-instructions, or the like, or any combination of two or more of the foregoing.

Furthermore, the term "memory" refers to any processor-readable medium, including but not limited to RAM, ROM, EPROM, PROM, EEPROM, disk, floppy disk, hard disk, CD-ROM, DVD, or the like, or any combination of two or more of the foregoing, on which may be stored a series of software instructions executable by a processor.

The terms "processor" or "CPU" refer to any device capable of executing a series of software instructions and includes, without limitation, a general- or special-purpose microprocessor, finite state machine, controller, computer, digital signal processor (DSP), or the like.

The phrases "survivor" and "non-survivor" paths are used to refer to the paths determined during the recording phase of the subject invention, in contrast to the "primary traceback" and "non-primary traceback" paths, which are determined during the traceback phase of the subject invention from the information determined during the recording phase.

FIG. 1A illustrates a high level block diagram of an embodiment of a system according to the invention. This system may be implemented as hardware, software, or a combination of hardware and software. As illustrated, symbols 102 are received over a communications channel. The symbols are encoded using a trellis code, i.e., a code that may be decoded using an algorithm that exploits a trellis description of the code. A trellis description is a representation comprising nodes corresponding to states, and branches between the nodes corresponding to state transitions.

The symbols are input to system 100. Responsive thereto, system 100 decodes the symbols using an algorithm based on a trellis description, and outputs bit or symbol estimates 104. In addition, the system 100 produces reliability metrics 106 for the bit or symbol estimates. The reliability metrics 106 are useful indicators of burst errors in the underlying bit or symbol estimates.

The system 100 may be used in a variety of applications in which it is useful to be able to detect the locations of burst errors in bit or symbol estimates. For example, in one application, the estimates and corresponding reliability metrics output by the system 100 are fed back to a tracking loop which performs carrier phase tracking for a demodulator in the receive chain. In a second example, involving symbols encoded through the series combination of a Reed Solomon encoder, a byte interleaver and a convolutional encoder, and which are decoded through the series combination of a Viterbi decoder, a byte de-interleaver, and a Reed Solomon erasure decoder, the estimates and corresponding reliability metrics communicate to the Reed Solomon erasure decoder the locations of unreliable input bits. In response, the Reed Solomon erasure decoder erases those input bits that are deemed to be unreliable.

FIG. 1B illustrates a block diagram of an implementation of the system 100. As illustrated, in this particular implementation, the system 100 comprises a processor 108, and a memory 110. The processor 108 is configured to access and execute software instructions stored in the memory 110. These software instructions embody one or more functions or procedures that will now be described.

One such function or procedure is augmenting at least a portion of a trellis representation to indicate non-survivor paths and path metric differentials related thereto. In one embodiment, this function or procedure begins by determining a survivor path ending at one or more nodes within the portion of the trellis representation, the survivor path having a path metric. Then, a pointer to the survivor path is stored at each such node.

Next, a non-survivor path ending at each such node is determined, the non-survivor path having a path metric. A path metric differential is assigned to the non-survivor path, wherein the path metric differential is derived from the difference between the path metrics of the survivor and non-survivor paths. A pointer to the non-survivor path is stored at the node along with the path metric differential assigned to the non-survivor path.

To further explain this procedure, consider the portion 200 of the trellis representation illustrated in FIG. 2A. This portion 200 is assumed to have been added to the rightmost portion of a trellis representation to reflect trellis encoded symbols received over a communications channel. At the left, two nodes are illustrated, corresponding to states $s_k^1$ and $s_k^2$ at time k. At the right, a node is illustrated corresponding to state $s_{k+1}^1$ at time k+1. A branch connects each of the nodes at time k to the node at time k+1.

The state probabilities for the states $s_k^1$ and $s_k^2$ are, respectively, $\sigma(s_k^1)$ and $\sigma(s_k^2)$. The state probability for the state $s_{k+1}^1$ is $\sigma(s_{k+1}^1)$ The branch metric for the branch connecting state $s_k^1$ to state $s_{k+1}^1$ is $\lambda_{11}$. The branch metric for the branch connecting state $s_k^2$ to $s_{k+1}^1$ is $\lambda_{21}$. In one implementation, the branch metric for a branch is the Euclidean distance $|r-s|^2$ between the received symbol r corresponding to the portion 200 of the trellis representation, and the symbol s corresponding to the branch. In one embodiment, the path metric for the path 202 entering state $s_{k+1}^1$ from state $s_k^1$ has the path metric $\sigma(s_k^1)+\lambda_{11}$, and the path metric for the path 204 entering state $s_{k+1}^1$ from state $s_k^2$ has the path metric $\sigma(s_k^2)+\lambda_{21}$. The survivor path is the path entering state $s_{k+1}^1$ which has the smallest path metric. The path metric for the survivor path is thus equal to MIN($\sigma(s_k^1)+\lambda_{11}$, $\sigma(s_k^2)+\lambda_{21}$). In this particular example, it is assumed that path 202, the one having the path metric $\sigma(s_k^1)+\lambda_{11}$, is the survivor path, and that path 204, the one having the path metric $\sigma(s_k^2)+\lambda_{21}$, is the non-survivor path.

Referring to FIG. 2B, a pointer 206 to this survivor path is stored at node 214, along with a pointer 208 to the non-survivor path, and the path metric differential, $\Delta^1_{k+1}$, representing the difference between the path metrics for survivor path 204 and non-survivor path 206, i.e., $\sigma(s_k^1)+\lambda_{11}-(\sigma(s_k^2)+\lambda_{21})=\sigma(s_k^1)-\sigma(s_k^2)+\lambda_{11}-\lambda_{21}$.

In one embodiment, pointers and path metric differentials for all non-survivor paths entering the node are stored. In an alternative embodiment, pointers and path metric differentials are only stored for the K non-survivor paths having the K smallest differentials, where K in an integer greater than 1. In yet another alternate embodiment, pointers and path metric differentials are only stored for those non-survivor paths where the absolute value of the differentials is less than a predetermined value V. Referring to FIG. 2C, two non-survivor paths 204, 210 enter node 214. Accordingly, pointer 208 and path metric differential $\Delta^1_{k+1}$ for non-survivor path 204 are stored at node 214, along with pointer 212 and path metric differential $\Delta^2_{k+1}$ for non-survivor path 210

Turning back to FIG. 1B, another function or procedure which may be performed by the software stored in memory 110 is the function or procedure of assigning a reliability metric to a bit or symbol estimate corresponding to a release point in a trellis representation. This function or procedure begins by updating a trellis representation with additional states and state transitions to reflect the receipt of trellis encoded symbols over a communications channel, and then correspondingly moving a sliding window within the trellis representation, the sliding window containing a portion of the trellis representation and the release point.

Figure 3B:
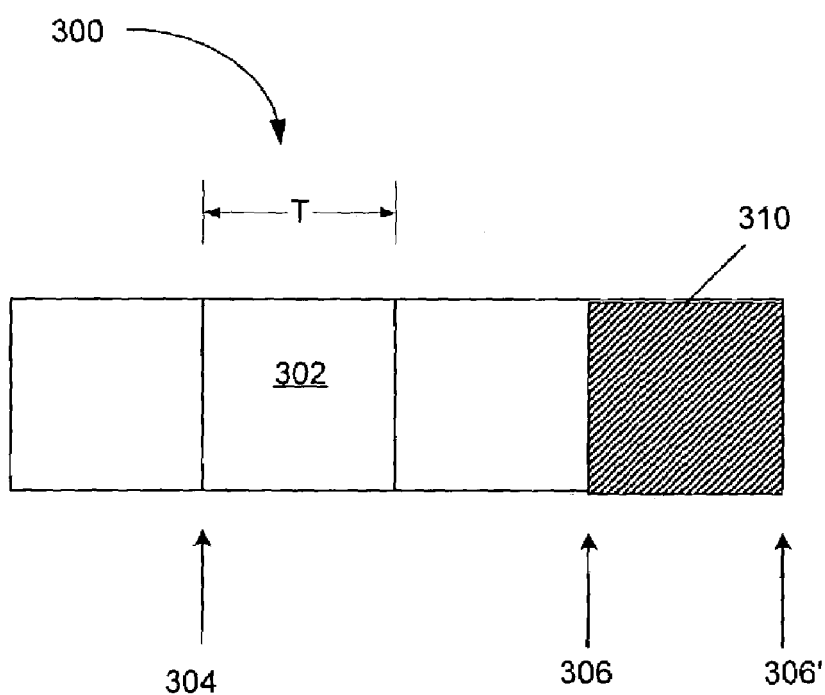

This portion of the procedure can be further explained with reference to FIGS. 3A–3C. FIG. 3A illustrates a trellis representation 300. A sliding window 302 contains a portion of the trellis representation. The sliding window has a width T. A release point 304 corresponds to the leftmost edge of the sliding window 302. The rightmost edge of the trellis representation is identified with numeral 306.

As or after trellis, encoded symbols are received over a communications channel, the trellis representation is updated with additional states and state transitions corresponding to the received symbols. In FIG. 3B, the updated portion of the trellis representation corresponding to the newly received symbols is the cross-hatched portion identified with numeral 310. This portion is added to the rightmost portion of the trellis representation. After this portion has been added, the new rightmost edge of the trellis representation is the edge identified with numeral 306'.

Figure 3C:
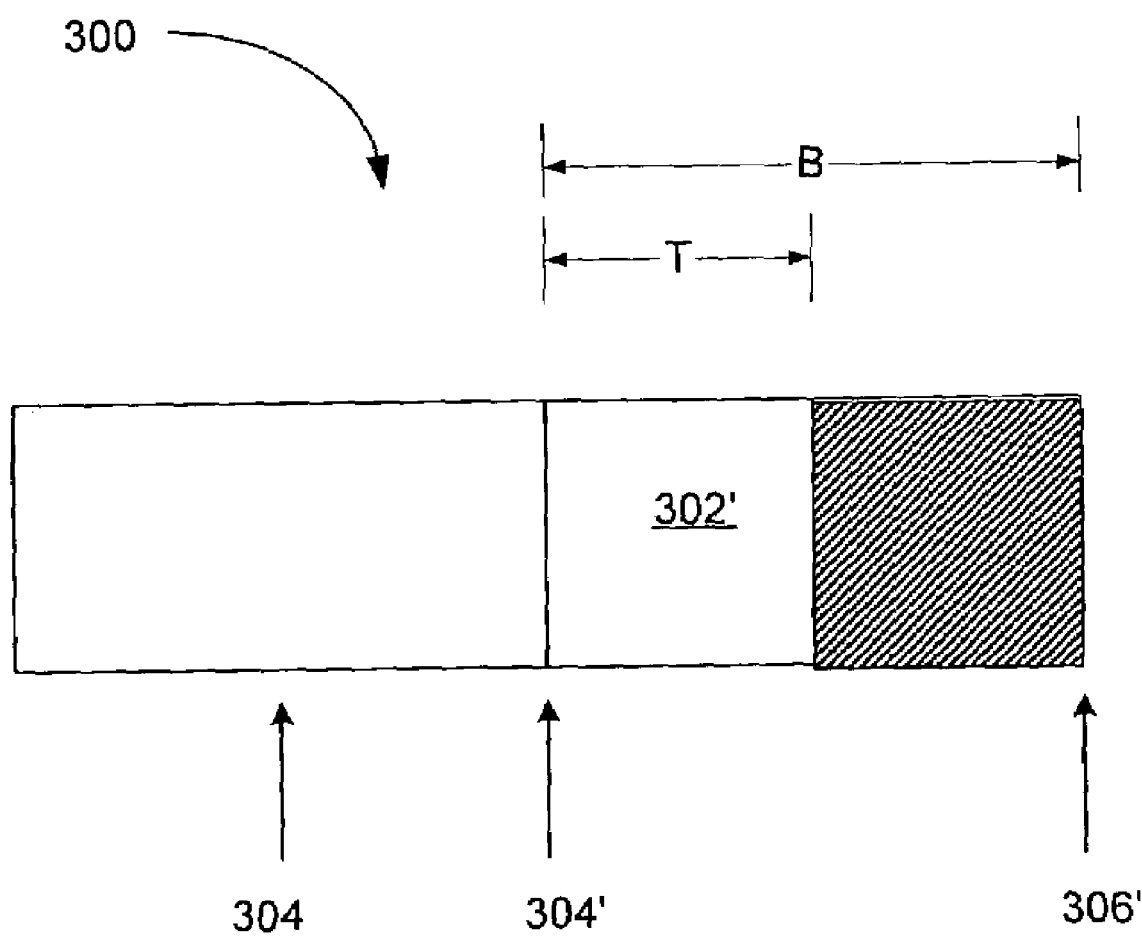

Referring to FIG. 3C, the sliding window 302 is then correspondingly moved forward in the trellis representation, thereby moving the release point forward from 304 to 304'. The degree to which the window can be moved forward is subject to the constraint that the trace-back length, identified in the figure with the letter B, should be generally no less than about 5–6 times the encoder constraint length. This practical rule of thumb typically gives decoding performance close to that of a decoder using an infinite trace-back length.

In the next step or phase of the procedure, a first path through the portion of the trellis representation within the sliding window is determined, the first path having a path metric that is smallest through the decoded data. A second path through the portion of the trellis representation within the sliding window is also determined. This second path diverges from the first path at the release point, and has a path metric that is second smallest through the decoded data.

A bit or symbol estimate corresponding to the release point is then estimated. This bit or symbol estimate is assigned a reliability metric derived from the difference in path metrics for the first and second paths.

Intuitively, the path metric differential is an accurate reliability indicator since large deviations between the path metrics of primary and non-primary traceback paths correctly translate into a high reliability metric, while small deviations between these metrics correctly translate into a low reliability metric.

Figure 4A:
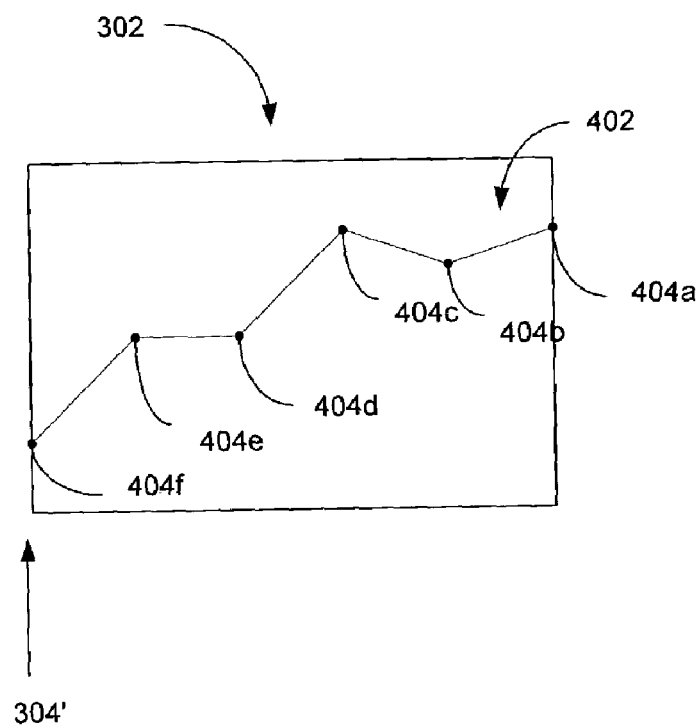
FIGS. 4A–4F illustrate examples of the process of locating a non-primary traceback path that diverges from the primary traceback path at a release point within a sliding window.

This phase of the procedure may be further explained with reference to FIGS. 4A–4F. FIG. 4A illustrates the sliding window 302 from FIG. 3C. Numerals 404a, 404b, 404c, 404d, 404e, and 404f identify some of the nodes within the portion of the trellis representation contained within the sliding window 302. These nodes are nodes along the primary traceback path entering node 404a, which is identified with numeral 402.

Figure 4B:
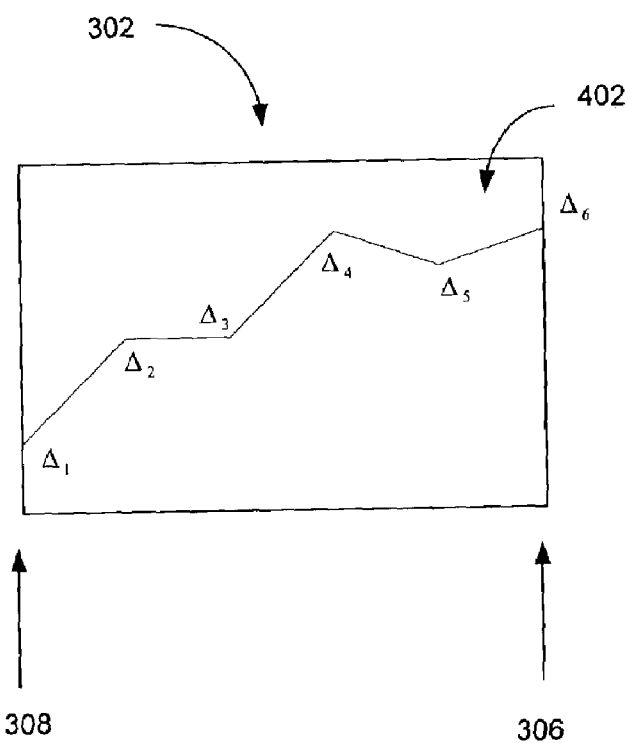

These nodes are augmented with the information discussed earlier, i.e., pointers to the non-survivor paths entering the nodes, and the path metric differentials associated with the non-survivor paths. FIG. 4B illustrates the path differentials, $\Delta_1$–$\Delta_6$, for the best non-survivor path entering each node.

The smallest of these path metric differentials is located. The corresponding path through the sliding window represents the most likely non-primary path. If this path diverges from the primary path at the release point 304, the bit or symbol estimate released at release point 304 is assigned, as a reliability metric, the path differential for this path.

Figure 4C:
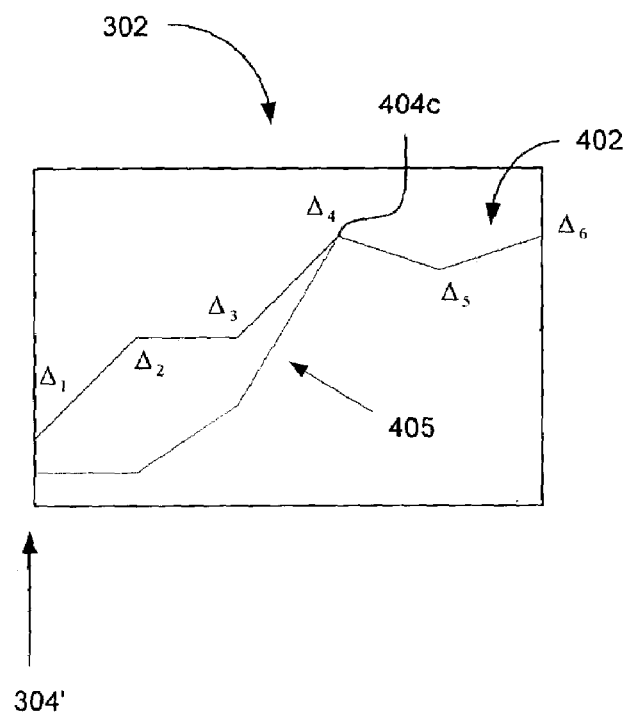

Thus, in FIG. 4C, the path metric differential for node 404c, $\Delta_4$, is assumed to be the smallest of those in the group $\Delta_1$–$\Delta_6$. Moreover, the traceback path associated with this differential, identified with numeral 405, deviates from the primary path 402 at the release point 304'. Accordingly, the differential $\Delta_4$ is assigned as a reliability metric to the bit or symbol estimate corresponding to release point 304.

Figure 4D:
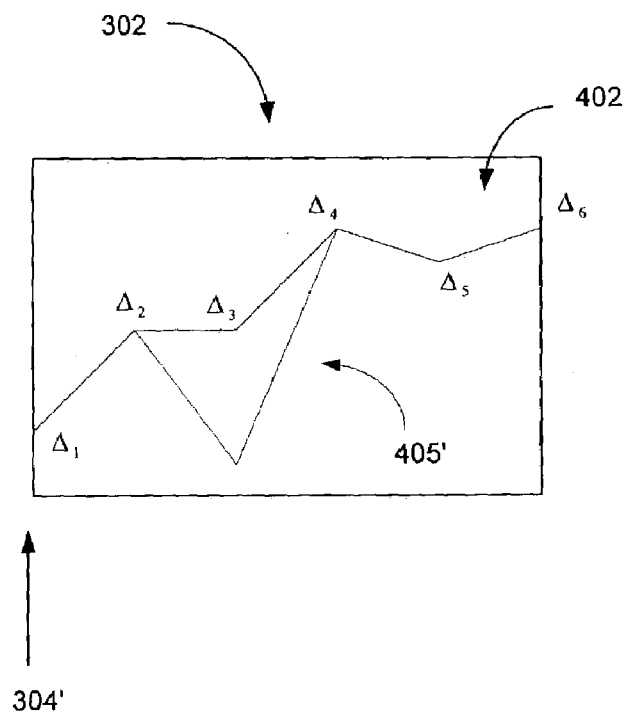

FIG. 4D illustrates the case where the path 405' does not deviate from the primary path at the release point 304'. In this case, a search is conducted for the next best non-primary path which deviates from the primary path 402 at the release point 304'.

Figure 4E:
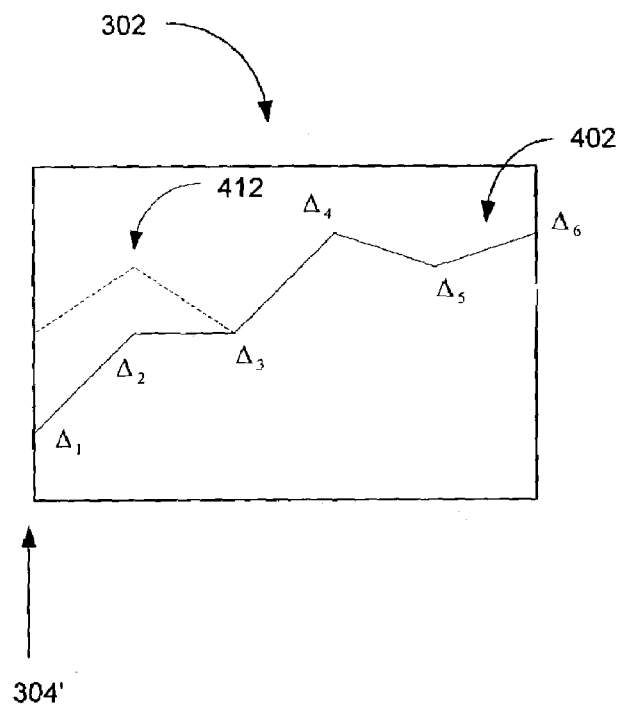
Figure 4F:
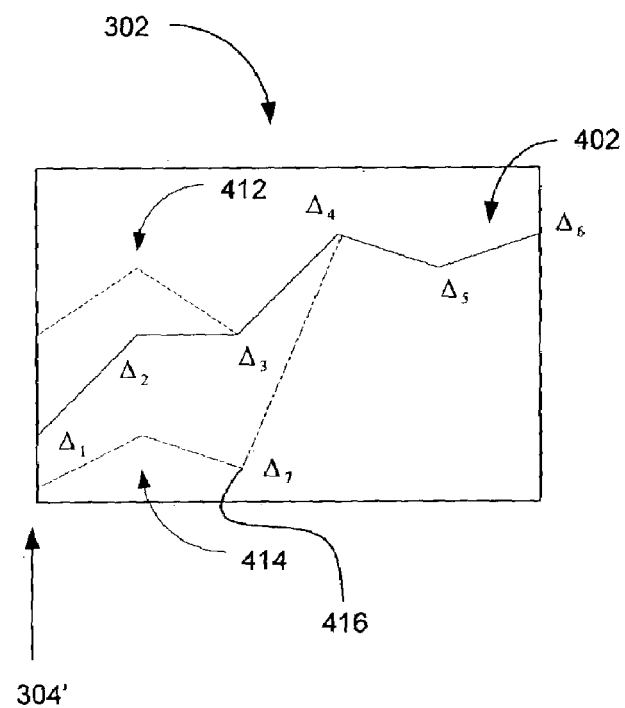

One candidate is the path 412 associated with the next best non-primary path entering the nodes situated along the primary path. In FIG. 4E, it is assumed that the differential $\Delta_3$ is the next best differential, after $\Delta_4$, for the nodes situated along the primary path.

This does not necessarily end the search, however, since other candidate paths may need to be considered, such as paths emanating from the node 404c, the node associated with the differential $\Delta_4$. One such path is path 414 illustrated in FIG. 4F. As shown, this path deviates from the path 405 shown in FIG. 4D at node 416. This path deviates from the path 405' at node 416. The path metric differential associated with this deviation is $\Delta_7$. Accordingly, the path metric differential for this path is the sum $\Delta_4+\Delta_7$.

The choice between paths 412 and 414 involves a simple comparison between the values $\Delta_3$ and the sum $\Delta_4+\Delta_7$. If the magnitude of the value $\Delta_3$ equals or exceeds the magnitude of the sum $\Delta_4+\Delta_7$, the path 416 is chosen, and the bit or symbol estimate corresponding to release point 304' is assigned the reliability metric $\Delta_4+\Delta_7$. If, on the other hand, the magnitude of the value $\Delta_3$ is less than the magnitude of the sum $\Delta_4+\Delta_7$, the path 412 is chosen, and the bit or symbol estimate corresponding to release point 304' is assigned the reliability metric $\Delta_3$.

Turning back to FIG. 1A, a third such function or procedure that may be embodied by the software stored in memory 110 is the function or procedure of assigning a reliability metric to a block of bit or symbol estimates corresponding to at least a portion of a release zone in the trellis representation. This function or procedure begins by updating the trellis representation with states and state transitions to reflect the receipt of trellis encoded symbols over a communications channel, and correspondingly moving a sliding window within the trellis representation, the window containing a portion of the trellis representation and the release zone.

Figure 5A:
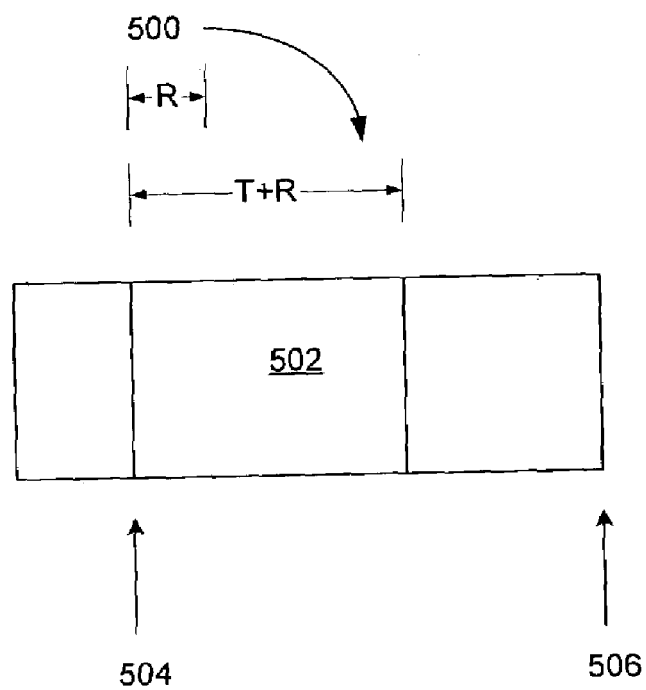
FIGS. 5A–5C illustrate an example of the process of updating a trellis representation with states and state transitions to reflect the receipt of encoded symbols over a communications channel, and correspondingly moving a sliding window having a release zone through the trellis representation.
Figure 5B:
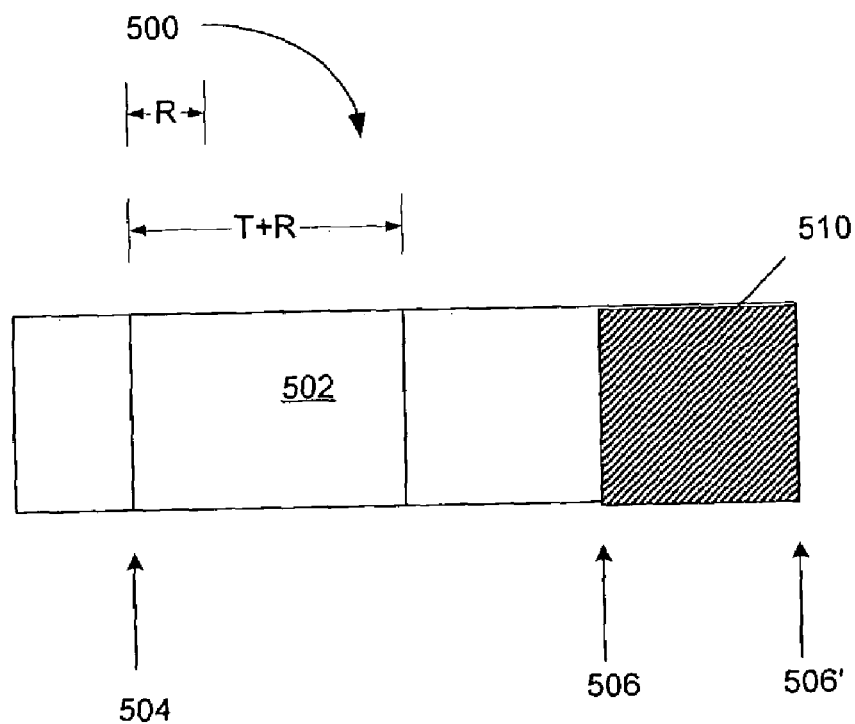

This portion of the procedure can be further explained with reference to FIGS. 5A–5C. FIG. 5A illustrates a trellis representation 500. A sliding window 502 contains a portion of the trellis representation. The sliding window has a width T+R, where R is the width of the release zone situated, in this particular example, at the leftmost portion of the sliding window. The rightmost edge of the trellis representation is identified with numeral 506.

As or after trellis encoded symbols are received over a communications channel, the trellis representation is updated with additional states and state transitions corresponding to the received symbols. In FIG. 5B, the updated portion of the trellis representation corresponding to the newly received symbols is the cross-hatched portion identified with numeral 510. This portion is added to the rightmost portion of the trellis representation. After this portion has been added, the new rightmost edge of the trellis representation is the edge identified with numeral 506'.

Figure 5C:
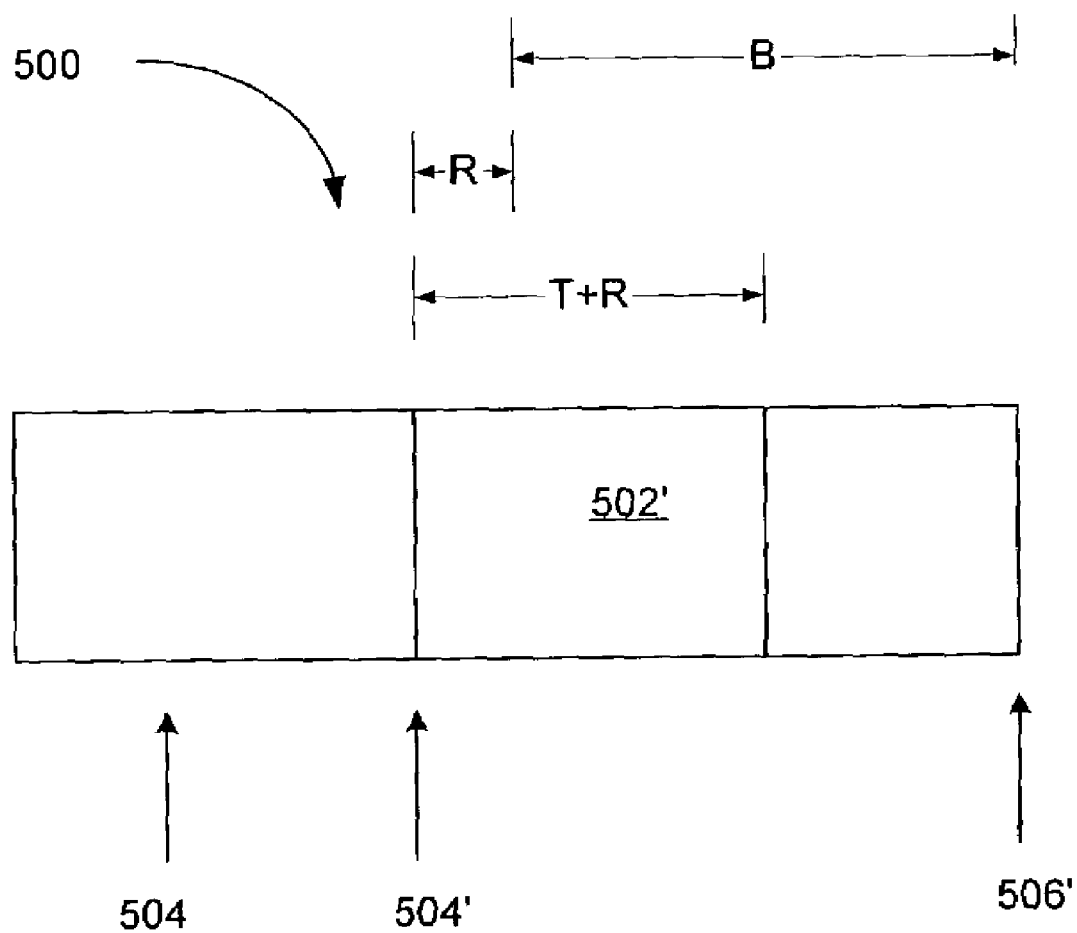

Referring to FIG. 5C, the sliding window 502 is then moved forward in the trellis representation, thereby moving the leftmost edge of the release zone forward from 504 to 504'. The degree to which the window can be moved forward is subject to the constraint that the trace-back length, identified in the figure with the letter B, should be no less than about 5–6 times the encoder constraint length (to obtain more favorable decoder performance).

In the next step or phase of the procedure, a first path through the portion of the trellis representation within the window is determined, the first path having a path metric. A second path through the portion of the trellis representation within the sliding window is also determined. This second path diverges from the first path throughout at least a portion of the release zone.

A block of bit or symbol estimates, corresponding to the portion of the release zone where the paths diverge, is estimated. A reliability metric is assigned to the block, the reliability metric being derived from the difference between the reliability metrics for the first and second paths.

Figure 6A:
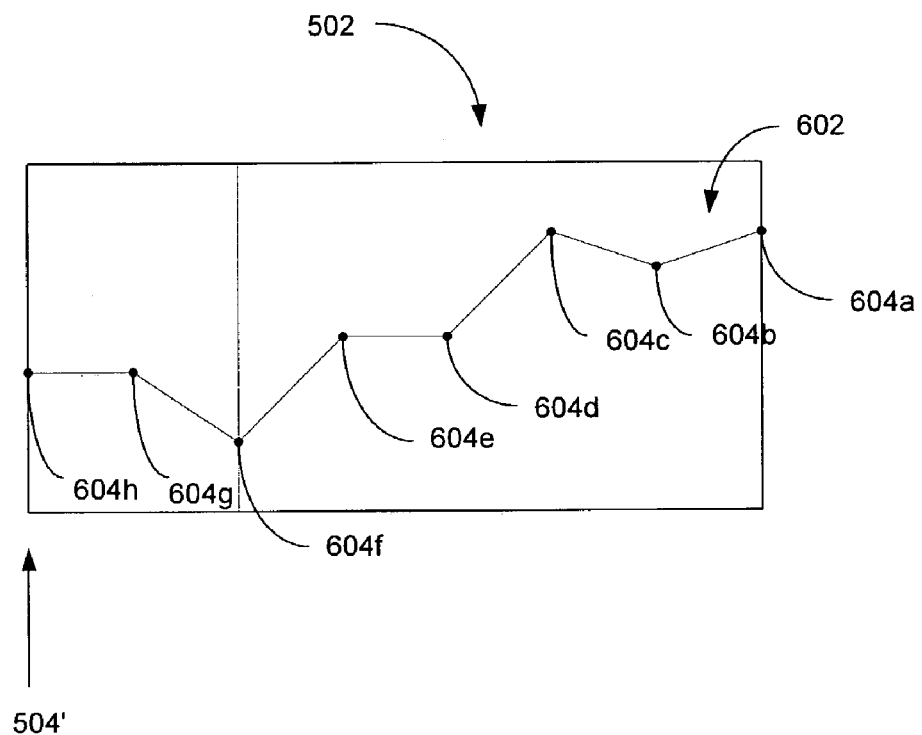
FIGS. 6A–6F illustrate examples of the process of locating a non-primary traceback path that deviates from the primary traceback path over at least a portion of a release zone within the sliding window.

This phase of the procedure may be further explained with reference to FIGS. 6A–6F. FIG. 6A illustrates the sliding window 502 from FIG. 5C. Numerals 604a, 604b, 604c, 604d, 604e, 604f, and 604g identify some of the nodes within the portion of the trellis representation contained within the sliding window 502. These nodes are situated along the primary traceback path entering node 604a, which path is identified with numeral 602.

Figure 6B:
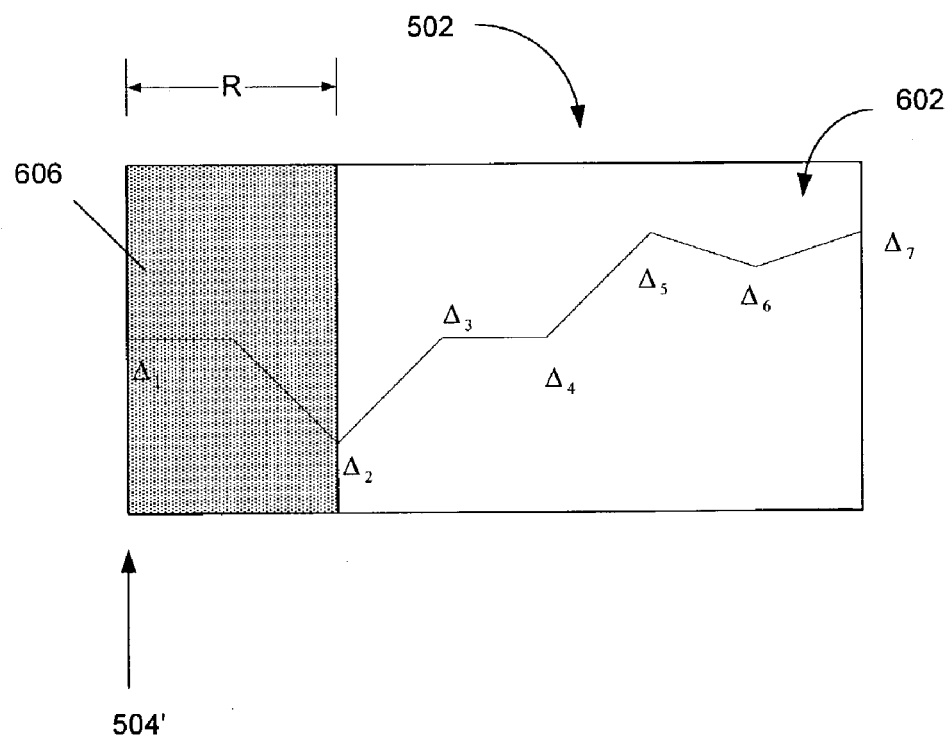

These nodes are augmented with the information discussed earlier, i.e., pointers to the non-survivor paths entering the nodes, and the path metric differentials associated with the non-survivor paths. FIG. 6B illustrates the path differentials, $\Delta_1$–$\Delta_7$ for the nodes, where the differentials correspond to the best non-survivor path entering each node.

The smallest of these path metric differentials is located. The corresponding non-primary traceback path represents the most likely non-primary path. If this path diverges from the primary path over at least a portion of the release zone 606, the bit or symbol estimates corresponding to this portion of the release zone is assigned, as a reliability metric, the path differential for this path.

Figure 6C:
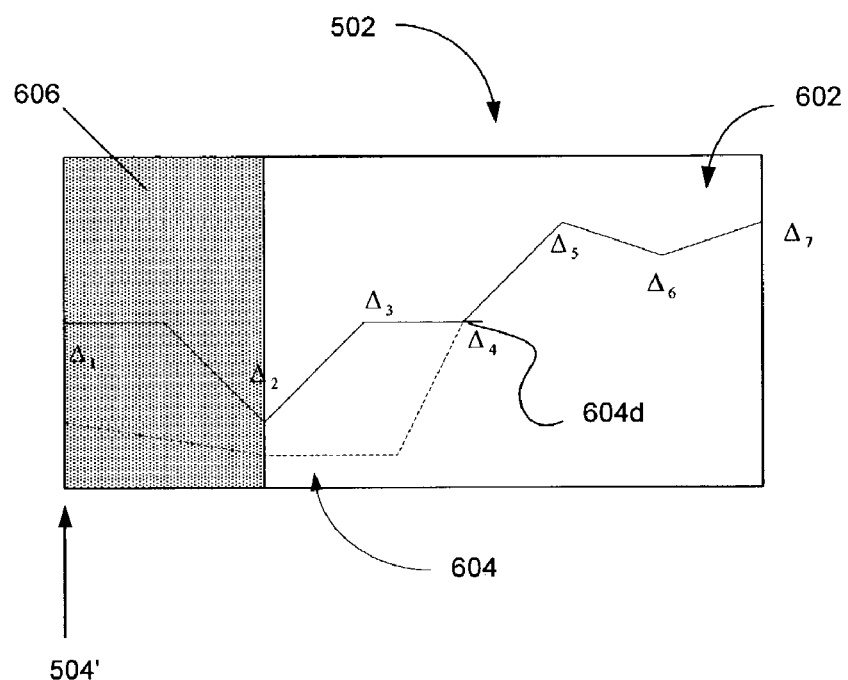

Thus, in FIG. 6C, the path metric differential for node 604d, $\Delta_4$, is assumed to be the smallest of those in the group $\Delta_1$–$\Delta_7$. Moreover, the path associated with this differential, identified with numeral 604, deviates from the primary path 602 over the entire release zone 606. Accordingly, the differential $\Delta_4$ is assigned as a reliability metric to the block of bit or symbol estimates corresponding to the release zone 606.

Figure 6D:
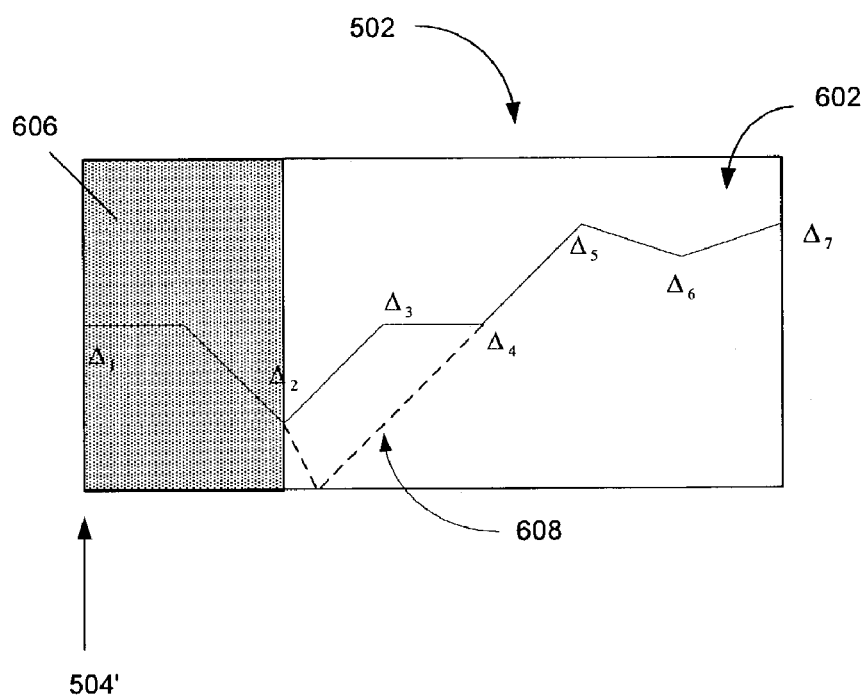

FIG. 6D illustrates the case where the best non-primary path, identified in the figure with numeral 608' and having the path metric differential $\Delta_4$, does not deviate from the primary path 602 over any portion of the release zone 606. In this case, a search is conducted for the next best non-primary path which deviates from the primary path 602 over at least a portion of the release zone 606.

One candidate is the path associated with the next best path metric differential for the nodes situated along the primary path. This path is identified in FIG. 6E with numeral 610. It is assumed that the differential $\Delta_3$ for this path is the next best differential, after $\Delta_4$, for the nodes situated along the primary path. However, note that path 610 only deviates from the primary path 602 over a portion 616 of the release zone 606. Over the remaining portion 618 of the release zone, the paths do not diverge from one another.

In this case, the bit or symbol estimates corresponding to the portion 616 of the release zone are assigned a reliability metric equal to the path metric differential $\Delta_3$. A search is then conducted for the next best non-primary path that diverges from the primary path over the remaining portion 618 of the release zone 606.

Figure 6E:
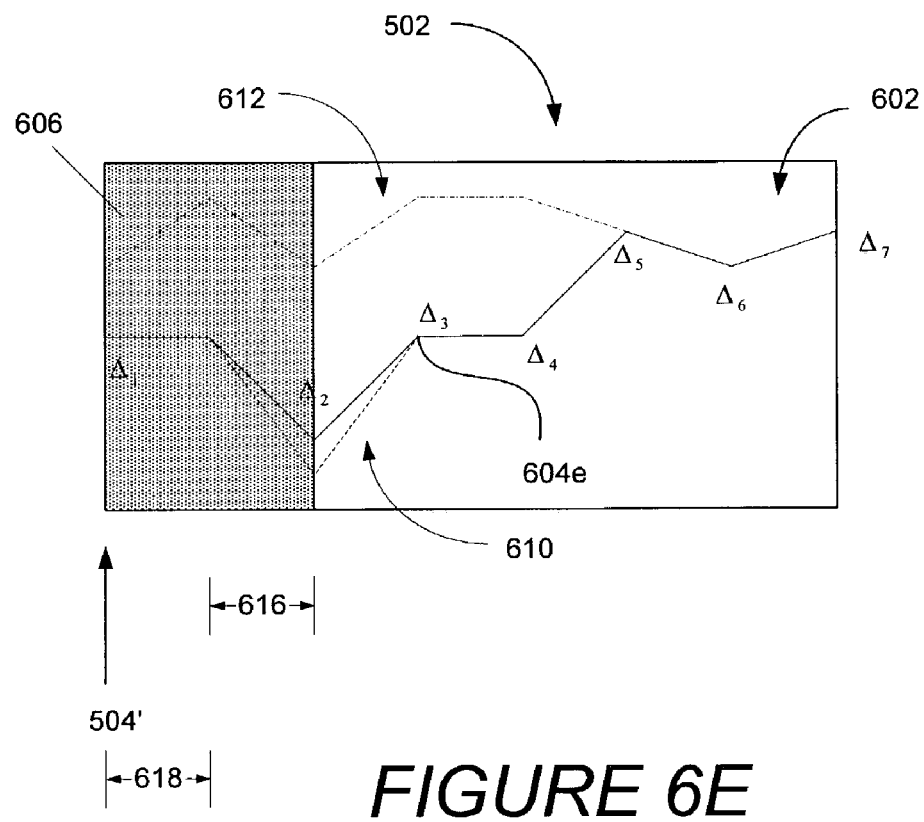
Figure 6F:
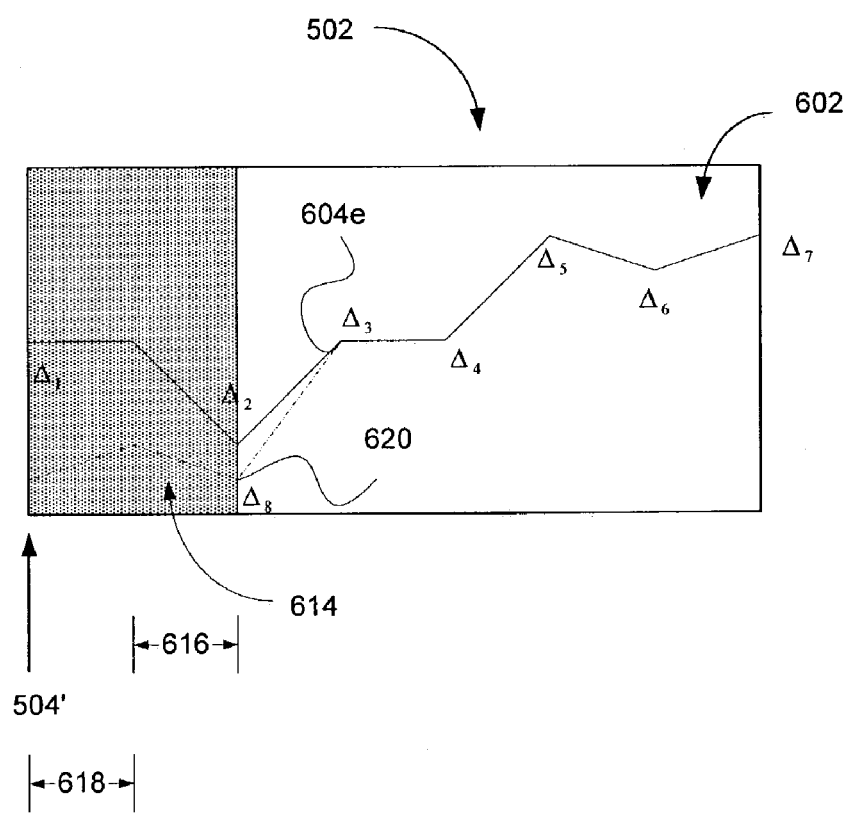

One such path is the path 612 identified in FIG. 6E. This path, which has a path differential of $\Delta_5$, is assumed to be the next best path based on consideration of the path metric differentials associated with the nodes situated along the primary path 602. However, other candidate paths that might need to be considered are paths emanating from the node 604e, the node associated with the differential $\Delta_3$, which deviate from the primary path 602 over the remaining portion 618 of the release zone 606. One such path is the path 614 illustrated in FIG. 6F. As shown, this path deviates from the path 610 shown in FIG. 6E at node 620. The path metric differential associated with this deviation is $\Delta_8$. Accordingly, the path metric differential for this path is the sum $\Delta_3+\Delta_8$.

The choice between paths 612 and 614 involves a simple comparison between the values $\Delta_5$ and the sum $\Delta_3+\Delta_8$. If the value $\Delta_5$ equals or exceeds the sum $\Delta_3+\Delta_8$, the path 614 is chosen, and the bit or symbol estimates corresponding to the remaining portion 618 of the release zone 606 are assigned the reliability metric $\Delta_3+\Delta_8$. If, on the other hand, the value $\Delta_5$ is less than the sum $\Delta_3+\Delta_8$, the path 612 is chosen, and the bit or symbol estimates corresponding to the remaining portion 618 of the release point zone 606 are assigned the reliability metric $\Delta_5$.

The software stored in memory 100 may also embody one or more methods that will now be described.

Figure 7A:
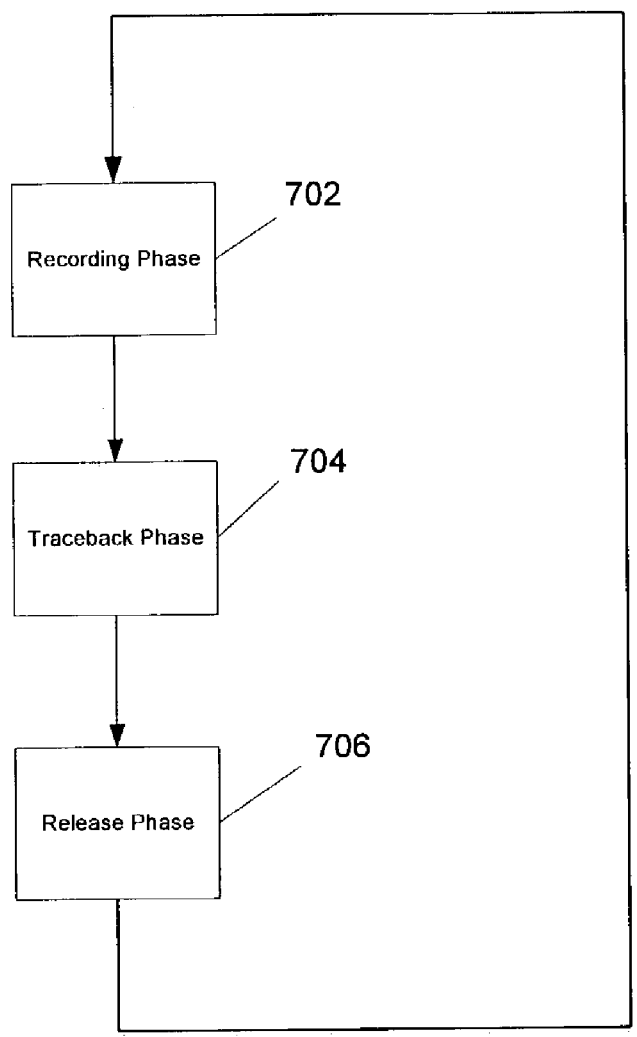
FIG. 7A is a flowchart of an embodiment of a method according to the invention comprising a recording phase, a traceback phase, and a release phase.

FIG. 7A is a flowchart of a method according to the invention which comprises a recording phase 702, a traceback phase 704, and a release phase 706. In the recording phase 702, a survivor path per state in a trellis section is identified and its identity is recorded. This is done for one or more of the states in the trellis section. The path metric differentials for some or all the non-survivor paths and their associated identities (i.e., indices) are also recorded. As discussed, in one implementation, pointers to and path metric differentials for each of the non-survivor paths entering a state are recorded. In alternate implementations, pointers and differentials are recorded only for selected non-survivor paths, e.g., the K smallest differentials, or where the differential magnitude is less than a predetermined value V. This recording phase may be implemented through a recording sub-system comprising hardware, software, or a combination of hardware and software.

The trackback phase 704 is performed after or concurrently with the recording phase 702. This traceback phase may be implemented through a traceback sub-system comprising hardware, software, or a combination of hardware and software operating in parallel with that implementing the recording phase. It uses data from the recording phase 702 as its inputs, and traces back in time, starting from a particular state in the trellis section, over a certain number of trellis sections. The starting state may either be a known state, an arbitrarily selected state, or the state with the best path metric within the trellis section. In one implementation, the traceback phase begins by moving a sliding window forward by a predetermined amount in a trellis section, and then beginning traceback processing at the rightmost state of the portion of the trellis section within the sliding window.

After the starting state has been determined, the traceback phase proceeds by tracing back over a number of trellis sections within the sliding window. As the traceback phase tracks backwards through the trellis in time, in one embodiment, it always chooses to trace back along the survivor path entering each state. This process yields the primary traceback path.

Once the primary traceback path has been determined, the next step is to determine all or some of the next best non-primary traceback paths. In one implementation, only a selected number of traceback paths are determined to avoid excessive processing. The second best traceback path is selected by searching through all those non-primary paths with deviate from the primary path. Similarly, the third best traceback path is selected by searching through all those non-primary paths that deviate from the primary and second best non-primary paths. This process continues until the appropriate number of non-primary traceback paths have been identified.

The release phase 706 follows the traceback phase 704. This release phase may be implemented by a release sub-system which comprises hardware, software or hardware/software combination. In one embodiment, the release sub-system comprises hardware, software, or a combination of hardware and software which is the same as or shared with that of the traceback phase 704. This process involves determining the best of the non-primary traceback paths that deviates from the primary traceback path over a predetermined portion of the trellis section, and then releasing, for individual bits or symbols, or blocks of individual bits or symbols, bit or symbol estimates and reliability metrics derived from the difference in path metric differential between the primary and best non-primary traceback paths.

The method of FIG. 7A continues to iterate as new encoded information is received. Once an iteration has completed, and new encoded information is received, the method jumps back to step 702 for an additional iteration.

Figure 7B:
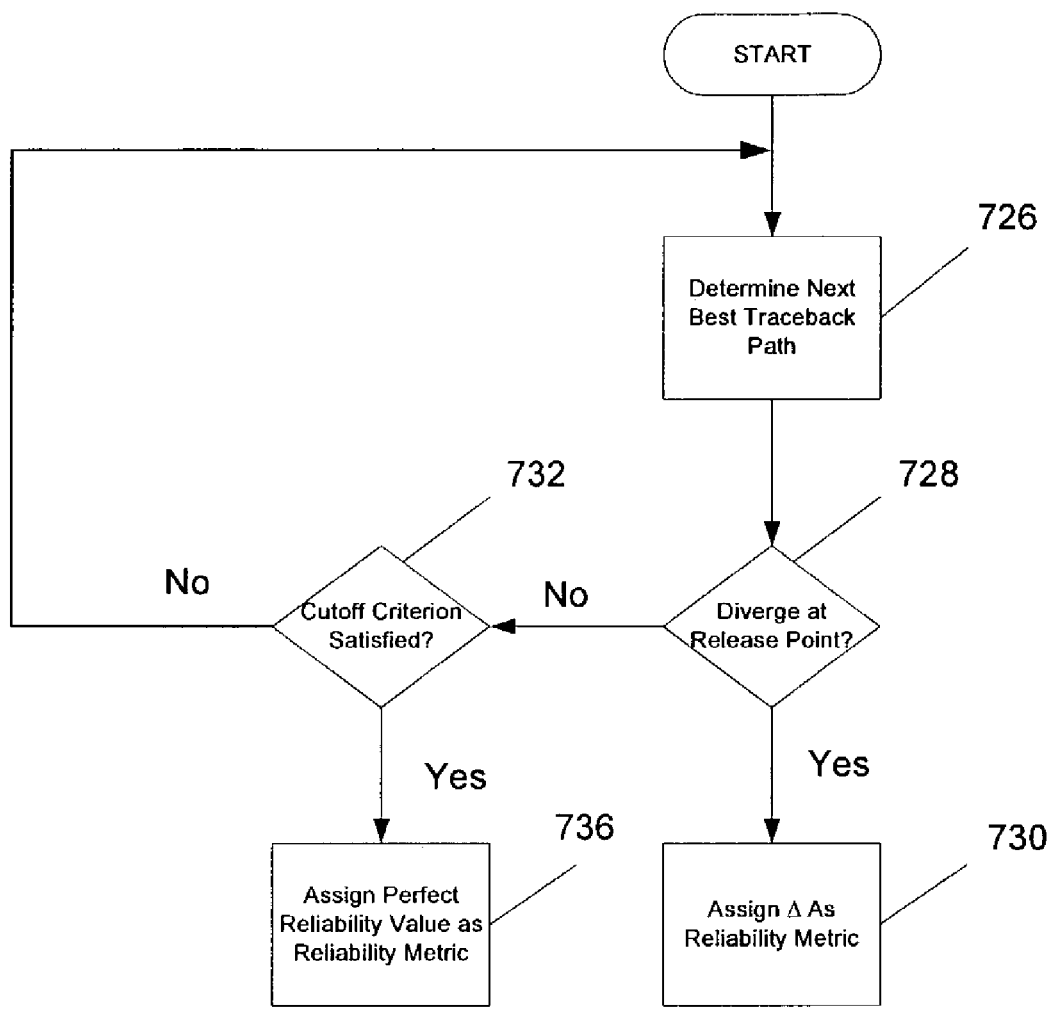
FIG. 7B is a flowchart of an embodiment of the traceback and release phases of the method of FIG. 7A wherein a reliability metric, derived from the difference between the path metrics of primary and non-primary traceback paths that deviate from one another at a release point, is assigned to a bit or symbol estimate corresponding to the release point.

FIG. 7B is a flowchart illustrating an embodiment of the traceback and release phases of the method of FIG. 7A, wherein a reliability metric is released for a bit or symbol estimate corresponding to a release point in a trellis representation. The embodiment begins with step 706. In step 726, the next best non-primary traceback path through the portion of the trellis representation within the sliding window is determined, beginning with the second best traceback path.

Step 728 follows step 726. In step 728, it is determined whether this next best path diverges from first path at the release point. If so, step 730 is performed; if not, step 732 is performed. In step 730, the bit or symbol estimate corresponding to the release point is assigned a reliability metric derived from the path metric differential associated with this next best path, and this reliability metric is then released along with the estimate. The method then concludes.

In step 732, it is determined whether one or more selected cutoff criteria have been satisfied. In one embodiment, a cutoff criterion is expressed in terms of a maximum number of iterations that are allowed. If the cutoff criterion is satisfied, step 736 is performed. If the cutoff criterion is not satisfied, a jump back to step 732 is performed for another iteration.

In step 736, the bit or symbol estimate corresponding to the release point is assigned a "perfect", i.e., highest, reliability metric or at least a high reliability metric, and this metric is then released along with the estimate. The method then concludes.

Figure 7C:
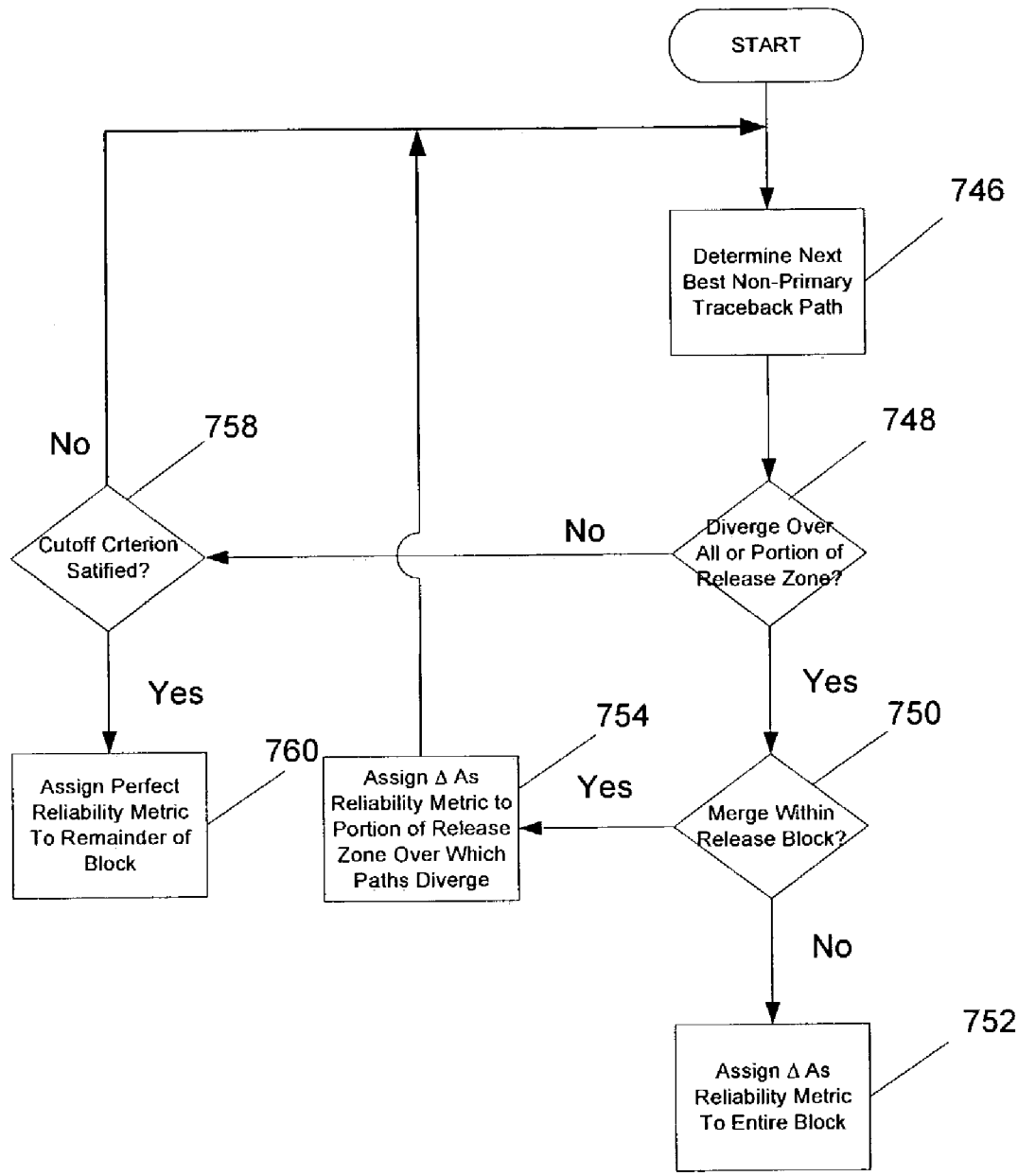
FIG. 7C is a flowchart of an embodiment of the traceback and release phases of the method of FIG. 7A, wherein a reliability metric, derived from the difference between the path metrics of primary and non-primary traceback paths that deviate from one another over all or a portion of a release zone, is assigned to a block of bit or symbols estimates corresponding to the portion of the release zone.

FIG. 7C is a flowchart illustrating an embodiment of the traceback and release phases of the method of FIG. 7A, wherein a reliability metric is released for a block of bit or symbol estimates corresponding to at least a portion of a release zone in the trellis representation. The embodiment begins with step 746. In step 746, the next best non-primary traceback path through the portion of the trellis representation within the sliding window is determined, starting with the second best path.

From step 746, the method proceeds to step 748. In step 748, it is determined whether this next best path diverges from the primary path throughout at least a portion of the release zone. If so, step 750 is performed. If not, step 758 is performed.

In step 750, it is determined whether this next best path merges with the primary path in the release zone. If so, step 754 is performed. If not, step 752 is performed.

In step 752, the block of bit or symbol estimates corresponding to the entire release zone are all assigned, as a reliability metric, the path metric differential for the second path, and this metric along with the block of estimates are then released. The method then concludes.

In step 754, the bit or symbol estimates corresponding to the portion of the release zone over which the primary and next best paths diverge are all assigned, as a reliability metric, the path metric differential for the next best path. This metric is then released, along with the estimates corresponding to the portion of the release zone where divergence is present.

In step 758, it is determined whether one or more selected cutoff criteria are satisfied. In one embodiment, one such criterion is whether all portions of the release block have been covered, i.e., assigned reliability metrics. If so, additional iterations are cut off.

In another embodiment, the cutoff criterion is whether a maximum number of allowed iterations has occurred. If so, additional iterations are cut off.

If one or more of the selected cutoff criterion are satisfied, step 760 is performed. In step 760, any remaining uncovered portion of the release zone, i.e., any remaining portion which has not yet been assigned a reliability metric, is assigned a "perfect", i.e., highest, reliability metric, or at least a high reliability metric. This metric, along with estimates corresponding to the remaining portion of the release zone, are then released. The method then concludes.

If none of the selected cutoff criterion are satisfied, the method proceeds to step 746 for another iteration.

While various embodiments of the invention have been described, it will be apparent to those of ordinary skill in the art that many more embodiments and implementations are possible that are within the scope of this invention. Accordingly, the invention is not to be restricted except in light of the attached claims and their equivalents.

What is claimed is:

1. A memory holding software instructions embodying a method of assigning a reliability metric to a bit or symbol estimate corresponding to a release point in a trellis representation, the method comprising the steps of:
   updating a trellis representation as or after trellis encoded symbols are received over a communications channel;
   moving a sliding window within the trellis representation, the sliding window containing a portion of the trellis representation and having a release point;
   determining a first path through the portion of the trellis representation within the sliding window, the first path having a path metric;
   determining a second path through the portion of the trellis representation within the sliding window which diverges from first path at the release point, the second path having a path metric; and
   assigning to a bit or symbol estimate corresponding to the release point a reliability metric derived from the difference in path metrics for the first and second paths.

2. A system comprising a processor and the memory of claim 1, wherein the processor is configured to access and execute the software instructions held in the memory.

3. The system of claim 2 wherein the first path is a primary traceback path through the portion of the trellis representation within the sliding window, and the second path is a non-primary traceback path through the portion of the trellis representation.

4. The system of claim 3 wherein the non-primary traceback path is the best non-primary traceback path through the portion of the trellis representation that diverges from the primary traceback path at the release point.

5. A memory holding software instructions embodying a method of assigning a reliability metric to a block of bit or symbol estimates corresponding to at least a portion of a release zone in a trellis representation, the method comprising the following steps:
   updating a trellis representation as or after trellis encoded symbols are received over a communications channel;
   moving a sliding window within the trellis representation, the sliding window containing a portion of the trellis representation and having a release zone;
   determining a first path through the portion of the trellis representation within the sliding window, the first path having a path metric;
   determining a second path through the portion of the trellis representation within the sliding window which diverges from the first path throughout at least a portion of the release zone, the second path having a path metric; and assigning to a block of bit or symbol estimates corresponding to the portion of the release zone where the first and second paths diverge a reliability metric derived from the difference between the path metrics for the first and second paths.

6. A system comprising a processor and the memory of claim 5, wherein the processor is configured to access and execute the software instructions held in the memory.

7. The system of claim 6 wherein the first path is a primary traceback path for the portion of the trellis representation within the sliding window.

8. The system of claim 7 wherein the second path is a non-primary traceback path for the portion of the trellis representation within the sliding window.

9. The system of claim 8 wherein the non-primary traceback path is the best non-primary traceback path that diverges from the primary traceback path over the portion of the release zone.

10. A memory holding software instructions embodying a method of augmenting at least a portion of a trellis representation, the method comprising the following steps for each of one or more nodes in the trellis representation:
   determining a survivor path entering the node, the survivor path having a path metric;
   storing at the node a pointer to the survivor path;
   determining a non-survivor path entering the node, the non-survivor path having a path metric;
   storing at the node a pointer to the non-survivor path; and
   storing at the node a path metric differential derived from the difference between the path metrics of the survivor and non-survivor paths.

11. The memory of claim 10 further comprising storing at each of one or more nodes in the trellis representation a plurality of pointers to non-survivor paths entering the node, each having a path metric, and, for each such non-survivor path, storing at the node a path metric differential derived from the difference between the path metrics of the survivor and non-survivor paths.

12. A memory embodying a trellis representation having one or more nodes, and storing, at each such node, a pointer to a survivor path entering the node, a pointer to a non-survivor path entering the node, and a path metric differential for the non-survivor path derived from the difference between the path metrics of the survivor and non-survivor paths.

13. The memory of claim 12 wherein the non-survivor path for a node is the best non-survivor path entering the node.

14. The memory of claim 12 storing, at each such node, a plurality of pointers to non-survivor paths entering the node, and a plurality of path metric differentials for each of the non-survivor paths entering the node.

15. A method of assigning a reliability metric to a bit or symbol estimate corresponding to a release point in a trellis representation, the method comprising the steps of:
   updating a trellis representation as or after trellis encoded symbols are received over a communications channel;
   moving a sliding window within the trellis representation, the sliding window containing a portion of the trellis representation and having a release point;
   determining a first path through the portion of the trellis representation within the sliding window, the first path having a path metric;
   determining a second path through the portion of the trellis representation within the sliding window which diverges from first path at the release point, the second path having a path metric; and
   assigning to a bit or symbol estimate corresponding to the release point a reliability metric derived from the difference in path metrics for the first and second paths.

16. The method of claim 15 wherein the first path is a primary traceback path through the portion of the trellis representation within the sliding window, and the second path is a non-primary traceback path through the portion of the trellis representation.

17. The method of claim 16 wherein the non-survivor path is the best non-primary traceback path through the portion of the trellis representation that diverges from the primary traceback path at the release point.

18. A method of assigning a reliability metric to a block of bit or symbol estimates corresponding to at least a portion of a release zone in a trellis representation, the method comprising the following steps:
   updating a trellis representation as or after trellis encoded symbols are received over a communications channel;
   moving a sliding window within the trellis representation, the sliding window containing a portion of the trellis representation and having a release zone;
   determining a first path through the portion of the trellis representation within the sliding window, the first path having a path metric;
   determining a second path through the portion of the trellis representation within the sliding window which diverges from the first path throughout at least a portion of the release zone, the second path having a path metric; and
   assigning to a block of bit or symbol estimates corresponding to the portion of the release zone where the first and second paths diverge a reliability metric derived from the difference between the path metrics for the first and second paths.

19. The method of claim 18 wherein the first path is a primary traceback path for the portion of the trellis representation within the sliding window.

20. The method of claim 19 wherein the second path is a non-primary traceback path for the portion of the trellis representation within the sliding window.

21. The method of claim 20 wherein the non-primary traceback path is the best non-primary traceback path that diverges from the primary traceback path over the portion of the release zone.

22. A method of augmenting at least a portion of a trellis representation, the method comprising the following steps for each of one or more nodes in the trellis representation:
   determining a survivor path entering the node, the survivor path having a path metric;
   storing at the node a pointer to the survivor path;
   determining a non-survivor path entering the node, the non-survivor path having a path metric;
   storing at the node a pointer to the non-survivor path; and
   storing at the node a path metric differential derived from the difference between the path metrics of the survivor and non-survivor paths.

23. The method of claim 22 further comprising storing at each of one or more nodes in the trellis representation a plurality of pointers to non-survivor paths entering the node, each having a path metric, and, for each such non-survivor path, storing at the node a path metric differential derived from the difference between the path metrics of the survivor and non-survivor paths.

24. A method of assigning a reliability metric to a bit or symbol estimate corresponding to a release point in a trellis representation, the method comprising the steps of:

a step for updating a trellis representation as or after trellis encoded symbols are received over a communications channel;

a step for moving a sliding window within the trellis representation, the sliding window containing a portion of the trellis representation and having a release point;

a step for determining a first path through the portion of the trellis representation within the sliding window, the first path having a path metric;

a step for determining a second path through the portion of the trellis representation within the sliding window which diverges from first path at the release point, the second path having a path metric; and a step for assigning to a bit or symbol estimate corresponding to the release point a reliability metric derived from the difference in path metrics for the first and second paths.

25. A method of assigning a reliability metric to a block of bit or symbol estimates corresponding to at least a portion of a release zone in a trellis representation, the method comprising the following steps:

a step for updating a trellis representation as or after trellis encoded symbols are received over a communications channel;

a step for moving a sliding window within the trellis representation, the sliding window containing a portion of the trellis representation and having a release zone;

a step for determining a first path through the portion of the trellis representation within the sliding window, the first path having a path metric;

a step for determining a second path through the portion of the trellis representation within the sliding window which diverges from the first path throughout at least a portion of the release zone, the second path having a path metric; and a step for assigning to a block of bit or symbol estimates corresponding to the portion of the release zone where the first and second paths diverge a reliability metric derived from the difference between the path metrics for the first and second paths.

26. A method of augmenting at least a portion of a trellis representation, the method comprising the following steps for each of one or more nodes in the trellis representation:

a step for determining a survivor path entering the node, the survivor path having a path metric;

a step for storing at the node a pointer to the survivor path;

a step for determining a non-survivor path entering the node, the non-survivor path having a path metric;

a step for storing at the node a pointer to the non-survivor path; and a step for storing at the node a path metric differential derived from the difference between the path metrics of the survivor and non-survivor paths.

27. In a demodulator, receiver, decoder, or decoding system, a system for assigning a reliability metric to bit or symbol estimates comprising:

a recording sub-system for updating a trellis representation as or after trellis encoded symbols are received over a communications channel;

a traceback sub-system for (1) moving a sliding window within the trellis representation, the sliding window containing a portion of the trellis representation; (2) determining a first path through the portion of the trellis representation within the sliding window, the first path having a path metric; and (3) determining a second path through the portion of the trellis representation within the sliding window which diverges from the first path over some or all of the portion of the trellis representation within the sliding window, the second path having a path metric; and a release sub-system for assigning to one or more bit or symbol estimates a reliability metric derived from the difference in path metrics for the first and second paths.

28. The system of claim 27 wherein the release sub-system also releases the reliability metric and the one or more bit or symbol estimates it is assigned to.

29. The system of claim 27 wherein the recording and traceback sub-systems operating in parallel to one another.

30. The system of claim 27 wherein the traceback and release sub-systems are implemented in the same or shared hardware, software, or combination of hardware and software.

31. The system of claim 29 wherein the recording and traceback sub-systems are each implemented in dedicated hardware.

32. In a demodulator, receiver, decoder, or decoding system, a system for assigning a reliability metric to bit or symbol estimates comprising:

recording means for updating a trellis representation as or after trellis encoded symbols are received over a communications channel;

traceback means for (1) moving a sliding window within the trellis representation, the sliding window containing a portion of the trellis representation; (2) determining a first path through the portion of the trellis representation within the sliding window, the first path having a path metric; and (3) determining a second path through the portion of the trellis representation within the sliding window which diverges from the first path over some or all of the portion of the trellis representation within the sliding window, the second path having a path metric; and release means for assigning to one or more bit or symbol estimates a reliability metric derived from the difference in path metrics for the first and second paths.

* * * * *